United States Patent
Neubauer et al.

(10) Patent No.: US 7,110,591 B2
(45) Date of Patent: Sep. 19, 2006

(54) SYSTEM AND METHOD FOR RECOGNIZING MARKERS ON PRINTED CIRCUIT BOARDS

(75) Inventors: Claus Neubauer, Monmouth Junction, NJ (US); Ming Fang, Princteton Jct., NJ (US)

(73) Assignee: Siemens Corporate Research, Inc., Princeton, NJ (US)

( * ) Notice: Subject to any disclaimer, the term of this patent is extended or adjusted under 35 U.S.C. 154(b) by 551 days.

(21) Appl. No.: 09/819,211

(22) Filed: Mar. 28, 2001

(65) Prior Publication Data

US 2002/0168097 A1    Nov. 14, 2002

(51) Int. Cl.
*G06K 9/00*    (2006.01)

(52) U.S. Cl. ............. 382/147; 382/159; 382/170; 382/218; 348/126

(58) Field of Classification Search ........ 382/141, 382/144, 145, 147, 148–151, 159, 160, 168, 382/170, 209, 278
See application file for complete search history.

(56) References Cited

U.S. PATENT DOCUMENTS

| | | | |
|---|---|---|---|
| 5,204,911 A | 4/1993 | Schwartz et al. ........... 382/8 |
| 5,579,415 A | 11/1996 | Takano et al. ........... 382/282 |
| 5,696,838 A * | 12/1997 | Chiu et al. ........... 382/159 |
| 5,982,945 A | 11/1999 | Neff et al. ........... 382/271 |
| 6,031,539 A * | 2/2000 | Kang et al. ........... 345/419 |
| 6,307,914 B1 * | 10/2001 | Kunieda et al. ........... 378/65 |
| 6,310,964 B1 * | 10/2001 | Mohan et al. ........... 382/110 |
| 6,445,822 B1 * | 9/2002 | Crill et al. ........... 382/218 |
| 6,611,622 B1 * | 8/2003 | Krumm ........... 382/170 |
| 6,658,149 B1 * | 12/2003 | Wakahara et al. ........... 382/215 |
| 6,678,404 B1 * | 1/2004 | Lee et al. ........... 382/155 |

* cited by examiner

*Primary Examiner*—Samir Ahmed
*Assistant Examiner*—Charles Kim
(74) *Attorney, Agent, or Firm*—Donald B. Paschburg; Chau & Associates, LLP (57) ABSTRACT

A system and method for recognizing markers on, e.g., a PCB (printed circuit board). In one aspect, a system for recognizing a marker in an image comprises an image capture module (14) for extracting image features associated with an input image of a ROI (region of interest) captured through a lens 15, an image processor (16) comprising a first marker recognition processor (17) for recognizing a marker in the input image based on a normalized correlation and a second marker recognition processor (18) for recognizing a marker in the input image based on gray value histograms; a training module 19 for building template images and histograms that are used by the image processor (16) to detect a marker in the input image and a database (20) for indexing and storing trained template images and trained histograms.

14 Claims, 11 Drawing Sheets

Automatic determination of thresholds for overlapping class distributions.

FIG. 8

Automatic threshold determination for non-overlapping class distributions.

FIG. 9

*Extraction of a global histogram*

FIG. 10a

Extraction of multiple local histograms for marker recognition.

FIG. 10b

SYSTEM AND METHOD FOR RECOGNIZING MARKERS ON PRINTED CIRCUIT BOARDS

BACKGROUND

1. Technical Field

The present invention is generally related to a system and method for detecting markers on a PCB (printed circuit board) and, in particular, to a system and method for detecting markers on a PCB using an image processing technique based on histogram and template features.

2. Description of Related Art

Currently, electronic manufacturing is one of the major application fields of machine vision systems. In particular, before electrical components are placed on a PCB, the board and the components are inspected thoroughly in order to achieve high yield and to reduce repair costs. After inspection, defective circuits are marked so that they can be sorted from non-defective circuits and terminated from further processing.

Figure 1A:
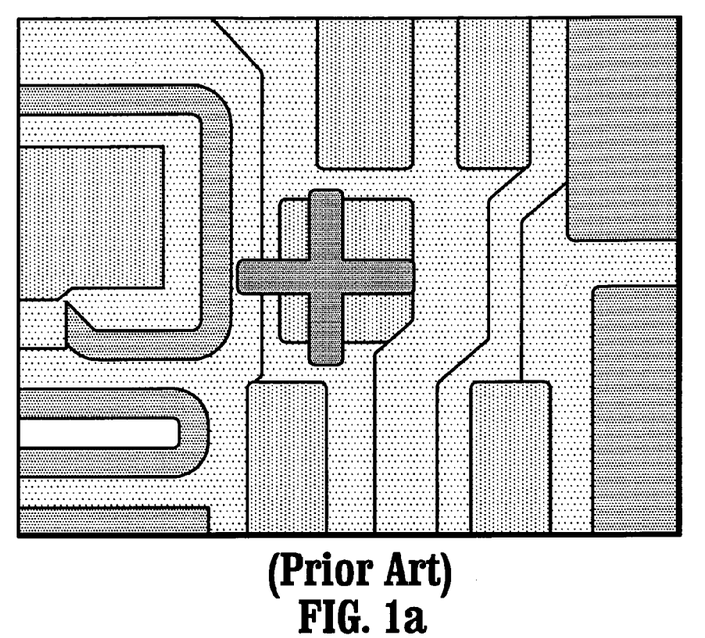
FIGS. 1a and 1b are exemplary images respectively illustrating a defective circuit on a PCB marked with a laser graving and the non-defective counterpart circuit.
Figure 1B:
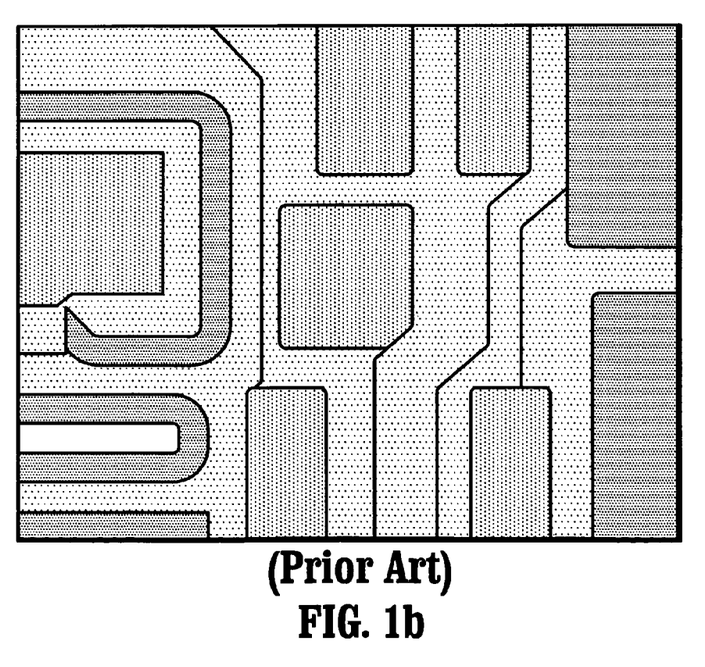
Figure 2A:
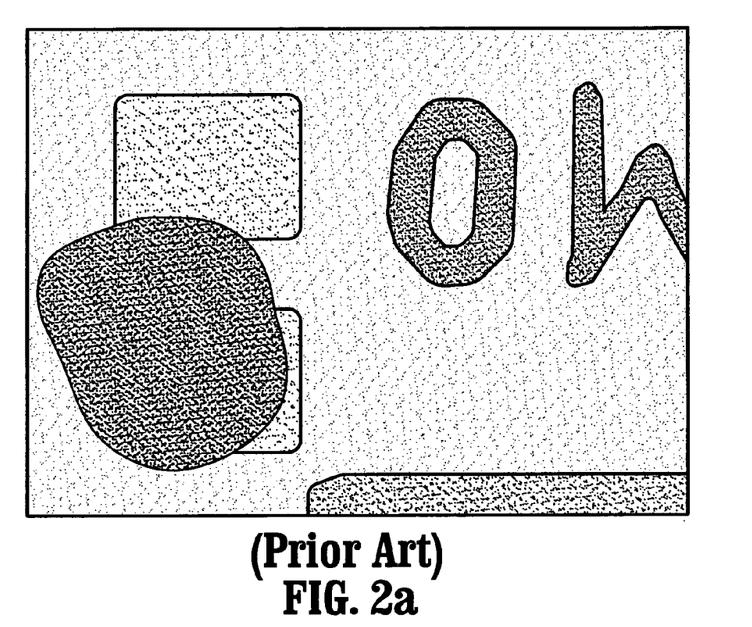
FIGS. 2a and 2b are exemplary images respectively illustrating a defective circuit on a PCB marked with a small ink spot and the non-defective counterpart circuit.
Figure 2B:
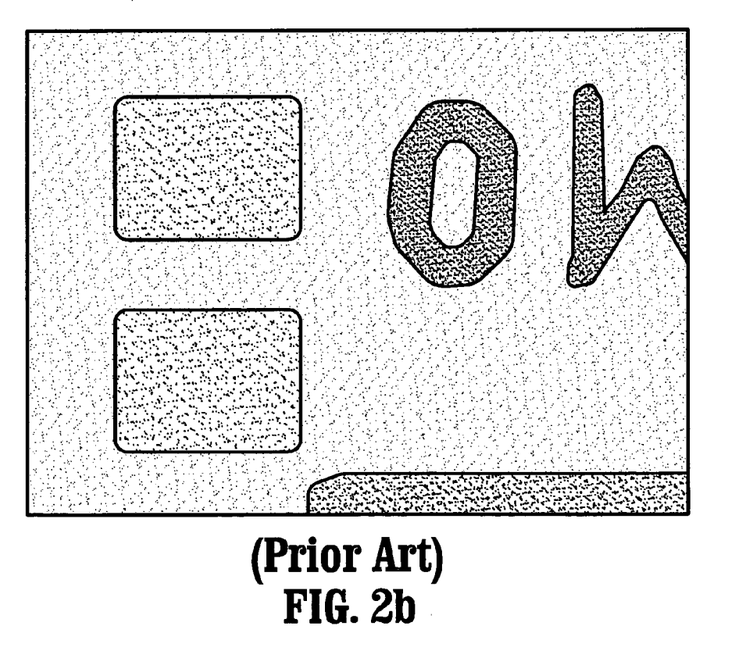
Figure 3A:
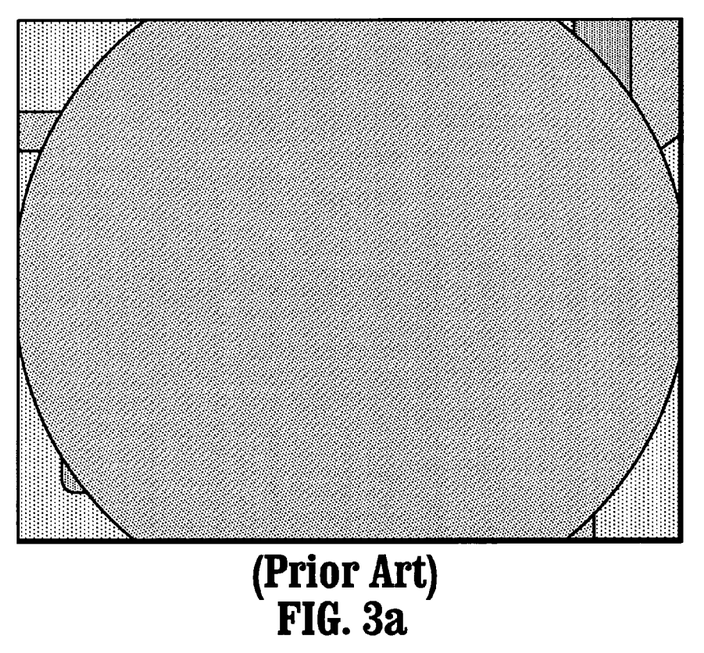
FIGS. 3a and 3b are exemplary images respectively illustrating a defective circuit marked with a large ink spot (covering an entire field of view) and the non-defective counterpart circuit.
Figure 3B:
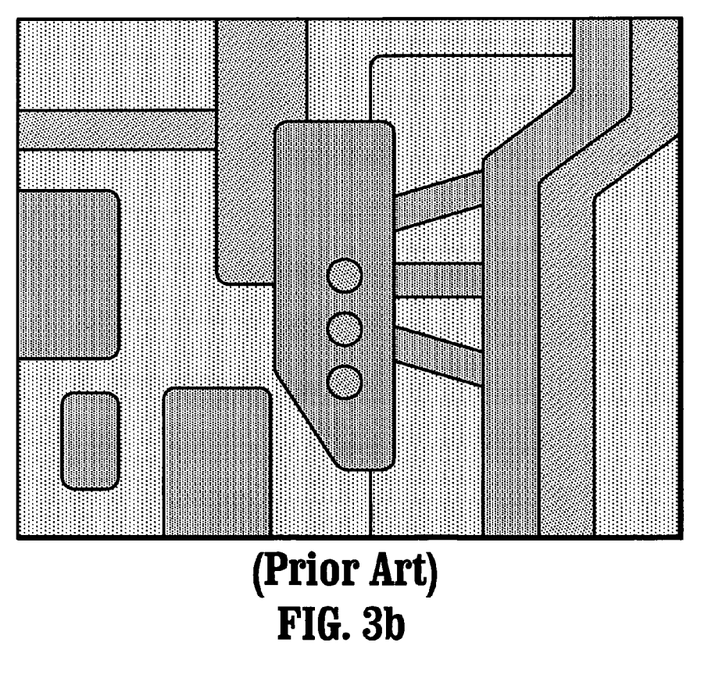
Figure 4A:
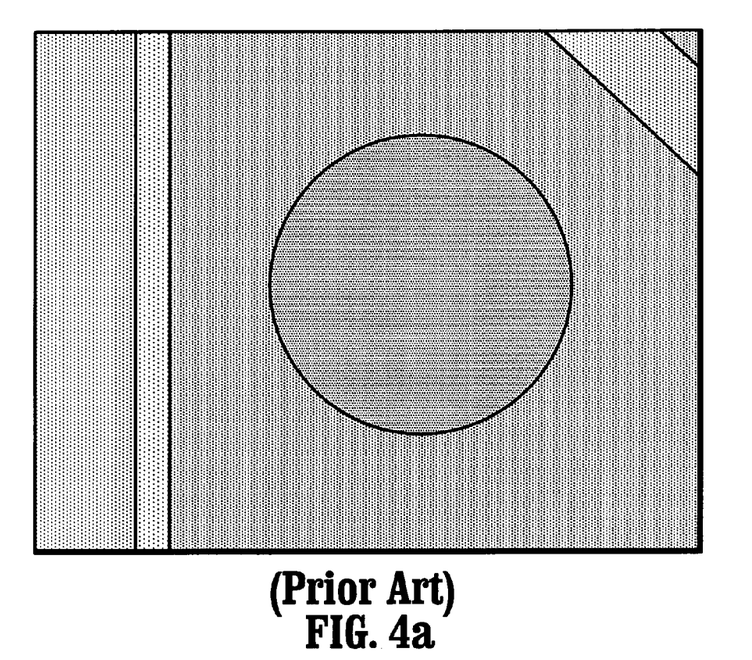
FIGS. 4a and 4b are exemplary images respectively illustrating a defective circuit marked with a drill hole marker and the non-defective counterpart circuit.
Figure 4B:
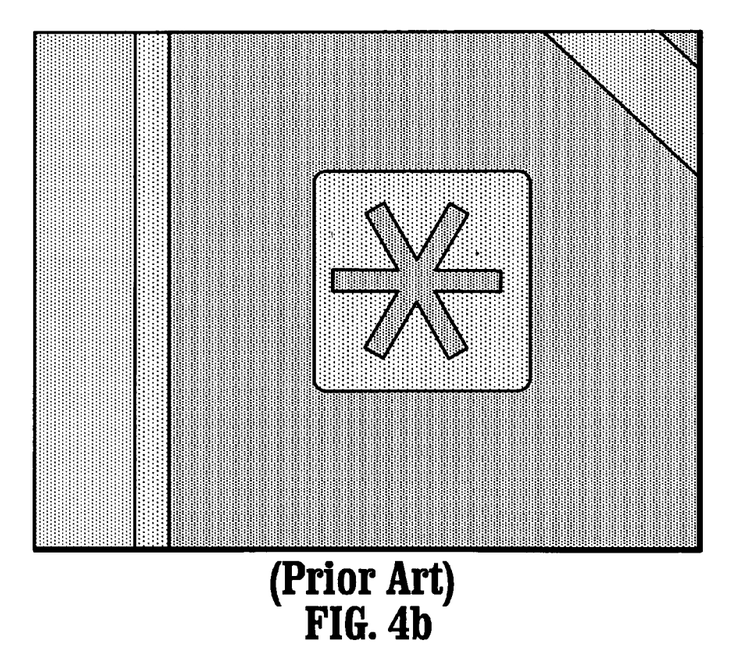

Various types of markers are implemented by manufacturers in their manufacturing processes. For instance, as shown in FIG. 1a, one type of marker that is used to mark a defective circuit is a laser graving (i.e., a cross). In addition, FIGS. 2a and 3a illustrate a small ink spot and a large ink spot marker, respectively. FIG. 3a illustrates a large ink spot marker that covers the entire field of view. Further, FIG. 4a illustrates a circuit that is marked by a drill hole. FIGS. 1b, 2b, 3b, and 4b are images of corresponding circuits that are not marked, thus, indicating non-defective ("good") circuits. The availability and use of such varying marker types can render a marker recognition process inefficient if the type of marker used is not particularly compatible with the recognition software.

Furthermore, there are several types of manufacturing processes that are implemented in electronic manufacture, which can limit the type of marker recognition process used. For instance, with one type of manufacturing process, the board is first calibrated (i.e., the exact position is detected and corrected for) before the marker is recognized. In another process, the marker is detected prior to calibration. Without prior calibration, the position variation can be large, which requires that the recognition algorithm used be robust with respect to shifts and small rotations. In this case, the use of large markers that cover the whole field of view (either ink spots or adhesive patches) is typically required.

Accordingly, a system and method for recognizing markers, which is robust and operatively compatible with a broad range of marker types, is highly desirable.

SUMMARY OF THE INVENTION

The present invention is directed to a system and method for recognizing markers on, e.g., a PCB (printed circuit board). In one aspect of the present invention, a method for detecting a marker in an image comprises the steps of: selecting either a first marker recognition process based on gray value histograms or a second marker recognition process based on a normalized correlation; extracting image features associated with an input image of a ROI (region of interest); and comparing the extracted image features with a trained model associated with the selected recognition process to determine if a marker is present in the input image.

In another aspect, for the marker recognition process based on a normalized correlation, the trained model comprises one or more template images that are generated during a training process. The step of comparing comprises the steps of normalizing the template image and input image with respect to brightness, computing a correlation between the normalized template image and input image, determining that a marker is present in the input image if the computed correlation meets a threshold. Preferably, normalizing comprises computing $I(i)=(I(i)-\mu)/\sigma$, where $I(i)$ is the gray value of pixel I and where $\mu$ and $\sigma$ denote the average brightness and contrast, respectively. In addition, the computing a correlation comprises computing $$\rho = \sum_{allpixels} I(i) * T(i)$$

where $\rho$ comprises the correlation coefficient, I comprises the input image, and T comprises the template image.

In another aspect of the invention, the template-based recognition process compares the input image with one or more template images a target marker and one or more template images not comprising a target marker.

In yet another aspect, a template image used in the template-based recognition process is computed from the average of a plurality of template images.

In another aspect, for the marker recognition process based on gray value histograms, the trained model comprises a sample image histogram comprising a gray value distribution of a sample image. The comparing comprises the steps of generating an input image histogram comprising a gray value distribution of the input image, computing a distance measure between the input image histogram and the sample image histogram, and determining if a marker is present in the input image based on the computed distance measure.

In another aspect, the input image histogram comprises either a global histogram or a plurality of local histograms.

The present invention is adapted to recognize all types of markers because it uses multiple features and it can be trained for specific markers by presenting sample images of both classes (good/bad). Further, because adaptive techniques are applied, the teach-in process is simplified and manual setting of parameters is minimized. The only decision that is to be made by hand is the choice between template and histogram algorithm. Subsequent parameters are determined automatically if sufficient training images are provided.

These and other objects, features and advantages of the present invention will be described or become apparent from the following detailed description of preferred embodiments, which is to be read in connection with the accompanying drawings.

DETAILED DESCRIPTION OF PREFERRED EMBODIMENTS

It is to be understood that the system modules and method steps described herein in accordance with the present invention may be implemented in various forms of hardware, software, firmware, special purpose processors, or a combination thereof. Preferably, the present invention is implemented in software as an application comprising program instructions that are tangibly embodied on one or more program storage devices (e.g., magnetic floppy disk, RAM, CD ROM, and ROM), and executable by any device or machine comprising suitable architecture. It is to be further understood that since the system modules and method steps depicted in the accompanying FIGURES are preferably implemented in software, the actual connections between the system modules and the logical flow of the process steps may differ depending upon the manner in which the present invention is programmed. Given the teachings herein, one of ordinary skill in the related art will be able to contemplate these and similar implementations or configurations of the present invention.

Figure 5:
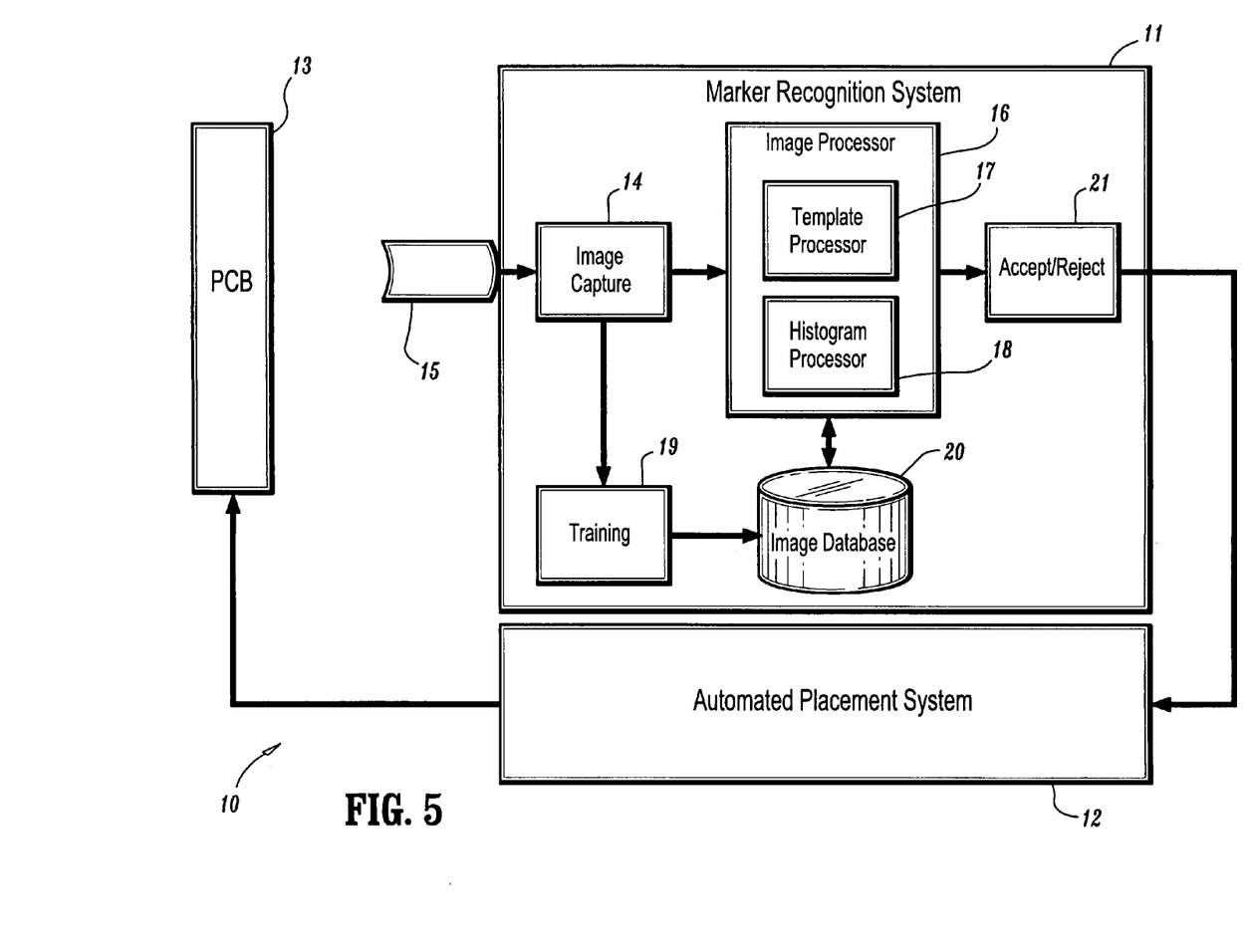
FIG. 5 is a block diagram of a system for recognizing markers on PCBs according to an embodiment of the present invention.

Referring to FIG. 5, a block diagram illustrates a system for recognizing markers on PCBs according to an embodiment of the present invention. The system 10 comprises a marker recognition system 11 that may be implemented with an automated placement system/machine/device 12 for detecting markers on a PCB (printed circuit board) 13. The marker recognition system 11 implemented in connection with the automated placement machine 12 provides automatic rejection of defective PCB boards before component placement. Various types of automated placement systems are well known in the art.

The marker recognition system 11 comprises an image capture module 14 for capturing and preprocessing an image of the PCB 13 within a given field of view (i.e., ROI (region of interest) of the PCB 13 through a lens 15. An image processor 16 is provided for processing image data captured by the image capture module 14 to detect a marker on the PCB 13, if any, within the captured ROI. In one embodiment of the present invention, the image processor 16 comprises a template processor 17 and a histogram processor 18. The image processor 16 implements a marker recognition algorithm comprising template-based processing and histogram-based processing for providing robust recognition of all marker types. Preferred marker recognition algorithms according to the present invention will be described below in further detail.

The marker recognition system 11 further comprises a training module 19. Depending on the implementation (as explained below), the training module is utilized for constructing one or more models or prototypes based on training images of defective PCBs having different marker types and/or training images of non-defective PCBs not including such marker types. These models are stored in an image database 20 and retrieved by the image processor 16 during a recognition process. Based on the results of the recognition process, an accept/reject module 21 outputs the requisite control signals to the automated placement system 12, causing the system 12 to either reject or accept the PCB 13 depending on whether a marker was detected.

In accordance with the present invention, from an image processing perspective, the various marker types are preferably categorized into at least two classes of markers. A first class includes those markers comprising a rather accurate and reproducible shape (e.g., a laser graved cross). In accordance with one aspect of the present invention, template-based processing is preferably used for the first class of markers, i.e., markers having well-defined shape. It is to be appreciated, however that although a template-based algorithm is particularly efficient for recognizing marker having a fixed shape, it is also efficient for recognizing most types of markers.

A second marker class comprises those markers that are defined by a particular contrast, brightness or gray value distribution, but not as well defined by shape (e.g., ink spot markers). In accordance with another aspect of the invention, for markers characterized by the gray value distinction, recognition is preferably based on histograms. A detailed explanation of preferred marker recognition algorithms will now be provided.

Figure 6:
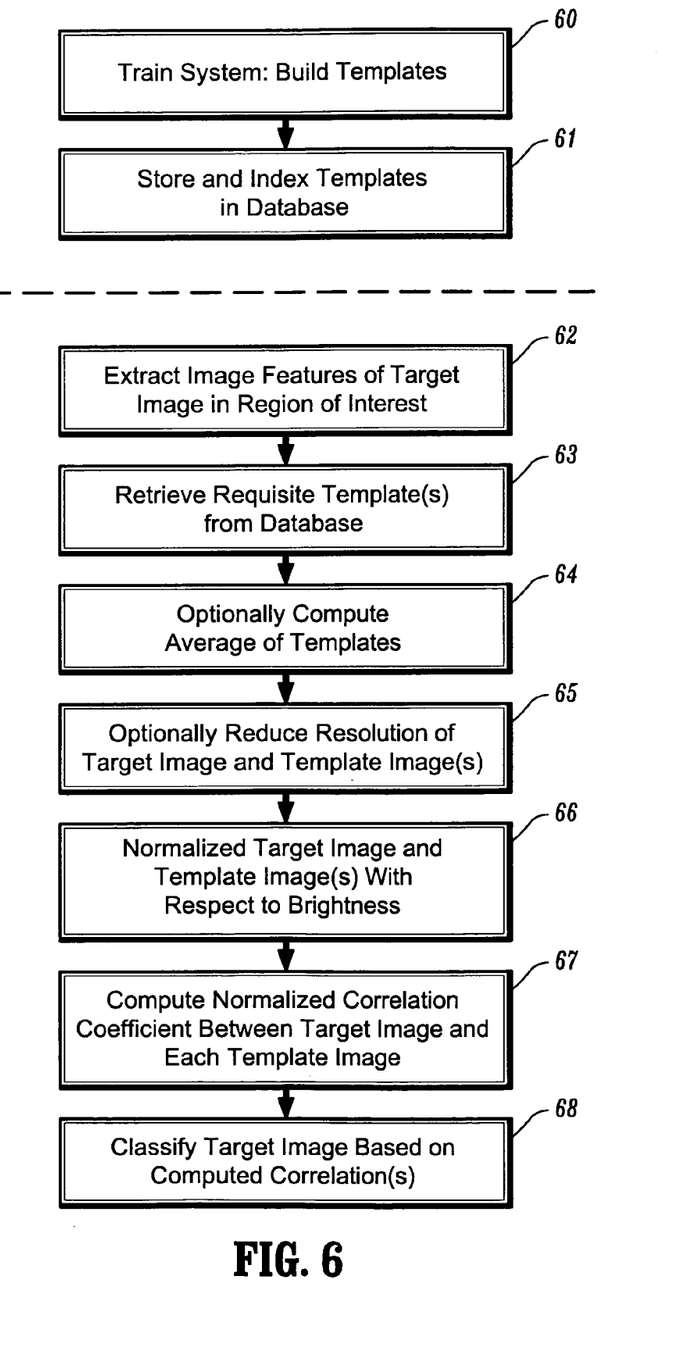
FIG. 6 is a flow diagram of a method for recognizing markers on a PCB according to one aspect of the present invention.

FIG. 6 is a flow diagram of a method for recognizing markers according to one aspect of the present invention using template-based marker recognition. Initially, prior to recognition, a training process is performed to train the marker recognition system (step 60). Training involves building one or more models ("templates") that are used in the template-based recognition process. Preferably, various types of models are generated during the training process. For example, a trained template could be generated using suitable features that are extracted from either one or more images of the PCB having a given marker (i.e., a "bad" template class) or one or more images of the same PCB not having the given marker (i.e., a "good" template class). By way of example, a template may be generated for a "cross" marker using the image of FIG. 1a and/or a template may be generated using the image of FIG. 1b containing a homogenous background and not the actual marker. Preferably, models for both template classes (good and bad) are generated so as to allow the user the option to specify which template class to be used as the template, based on the implementation and desired results. The templates that are constructed during training are stored for subsequent use during a marker recognition process (step 61).

Once the training process is complete and the preferred templates are available, a template-based marker recognition process according to the present invention may be performed to detect a marker on a PCB. The first step involves extracting the relevant image features from a target image within a ROI (region of interest) on the PCB (step 62). Preferably, the ROI is predetermined for the marker search. Depending on the circumstances, the ROI may comprise, for example, particular area on a PCB having a circuit whose electrical integrity or performance has been previously tested and either marked or not marked based on the results of such testing.

Furthermore, the size of the ROI is preferably selected based on whether the PCB is calibrated for marker detection. If the PCB is calibrated prior to marker detection, the marker (e.g., ink spot) will typically be located at the same position on the PCB with high accuracy (<1 pixel). In this circumstance, the search ROI should be equal in size to the trained template. If the position of the marker is not accurate, the search ROI should be selected such that is larger than the trained template. During recognition, the template is shifted within the search ROI to find the best correspondence. Generally, the ROI is preferably selected such that it is larger in area than the marker template thereby allowing for position variance.

Next, the requisite template(s) are retrieved from memory (step 63) depending on the implementation. For example, if a "cross" marker is being detected, the image processing system would retrieve the trained templates corresponding to such marker. In one embodiment (referred to herein as a "manual" process), the user specifies which class of templates (good or bad) to utilize for the recognition process. In this embodiment, as explained below, the target image is compared to each of the templates in the selected template class and the recognition results are determined based on the template having a maximum correlation coefficient above a predetermined threshold.

With template-based recognition, to obtain an optimal result, the more stable template pattern should be selected (i.e., the pattern having a consistent shape and size). With markers comprising well-defined shapes, typically, a template having the actual marker is stable. By way of example, in FIG. 1, the image containing the cross (FIG. 1*a*) is preferably used as a template rather than the counterpart image (FIG. 1*b*) not showing the cross marker. Indeed, selection of the image containing homogenous background FIG. 1*b* could result in a less than optimal performance of the template recognition method. In contrast, for the ink spot marker (FIG. 2), optimal recognition performance would be achieved using a template from the "good" template class (e.g., FIG. 2*b*) as opposed to the "bad" template class (e.g., FIG. 2*a*). This is because the ink spot marker is not consistent in size and shape. It can have arbitrary shape and vary considerably in size and location from image to image.

In another embodiment of template-based recognition (referred to herein as an "automatic" process), the recognition process is performed using both template classes (i.e., good and bad). In this case, as explained below, a rejection interval is based on the distributions of the correlation coefficients computed for templates in each template class.

Referring again to FIG. 6, once the requisite template(s) is/are retrieved, if multiple training images are available, several options are possible. For example, by default, an averaged template may be computed from the multiple templates (step 64). This provides more robust recognition that using just a single image. However, if the training patterns are very different from each other, an average template will not be computed. In such a circumstance, during recognition, the target image is preferably compared to each of the templates and, as explained below, classification is based on the maximum correlation coefficient.

Next, the ROI and each template image are sub-sampled by averaging each set of n×n pixels of the image data within the ROI (step 65). Preferably, n is set to 8 by default, but can be modified by the user. This sub-sampling step is preferably performed for several reasons. First, by limiting the image data, the computation speech can be increased. In addition, by reducing the resolution to a scale where the noise is suppressed but where the discriminating features are still present, the robustness of template matching is increased. As noted above, by default, the resolution is preferably reduced by a factor 8, which is sufficient for a marker covering a large part of a standard image format (640*480 pixels).

After the images are subsampled, the recognition process proceeds with an illumination normalization procedure (step 66). In particular, each of the templates as well as the input image are normalized as follows: I(i)=(I(i)−μ)/σ, where I(i) is the gray value of pixel I and where μ and σ denote the average brightness and contrast, respectively.

Next, for each template image, a normalized correlation is computed with respect to the target image (step 67). In particular, a normalized correlation is computed with respect to brightness and contrast as follows:

$$\rho = \sum_{allpixels} I(i) * T(i))$$

where ρ denotes the correlation coefficient, I denotes the target image, T denotes the template, and where ρϵ[−1,1] (where 1 indicates perfect correlation and −1 indicates anti-correlation).

Next, the target image is classified (i.e., reject/not reject) based on the computed correlation(s) (step 68). There are various embodiments according to the invention for implementing the classification step (i.e., step 68). For instance, in one embodiment, if the computed correlation coefficient for a given "bad" template image meets a predetermined threshold value, a marker is deemed detected, or if the computed correlation coefficient (for a given "good" template image) meets a predetermined threshold value, a marker is deemed not detected. In another embodiment, as noted above, if the target image is compared to multiple templates, classification will be based on the template image corresponding to the greatest computed correlation coefficient.

It is to be understood that in the case of an ink spot that covers the entire field of view (e.g., FIG. 3*a*), the normalized correlation would fail, since the brightness information is lost by normalization. Therefore, in such a circumstance, the average brightness is first compared to the brightness value of the template image determined during training and those patterns that deviate more than the typical illumination changes are classified as bad. Only patterns passing this test are compared with the templates.

In another embodiment of the classification process (step 68), the user can choose between an "automatic" threshold determination and "manual" threshold determination. The manual threshold selection is preferably used when there are no available templates from both classes. Namely, if there are only "good" templates, then the user can select a threshold, which is slightly lower (~10%) than the correlation coefficients within the "good" class. However, since this selection is rather arbitrary, it is preferred to gather samples from both classes and to use the automatic threshold selection.

Figure 7:
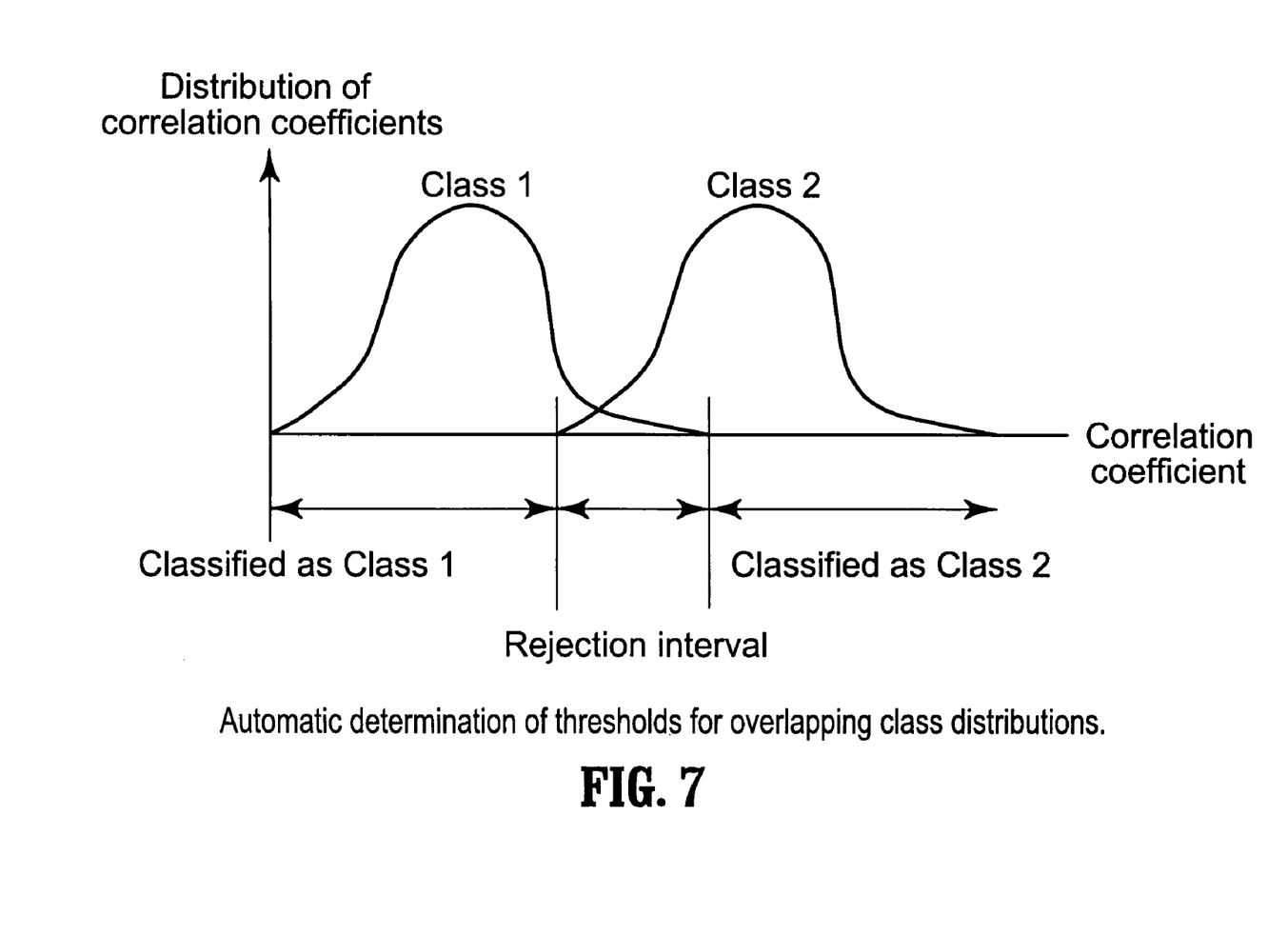
FIG. 7 is a diagram illustrating a method for automatic threshold determination according to one aspect of the present invention.
Figure 8:
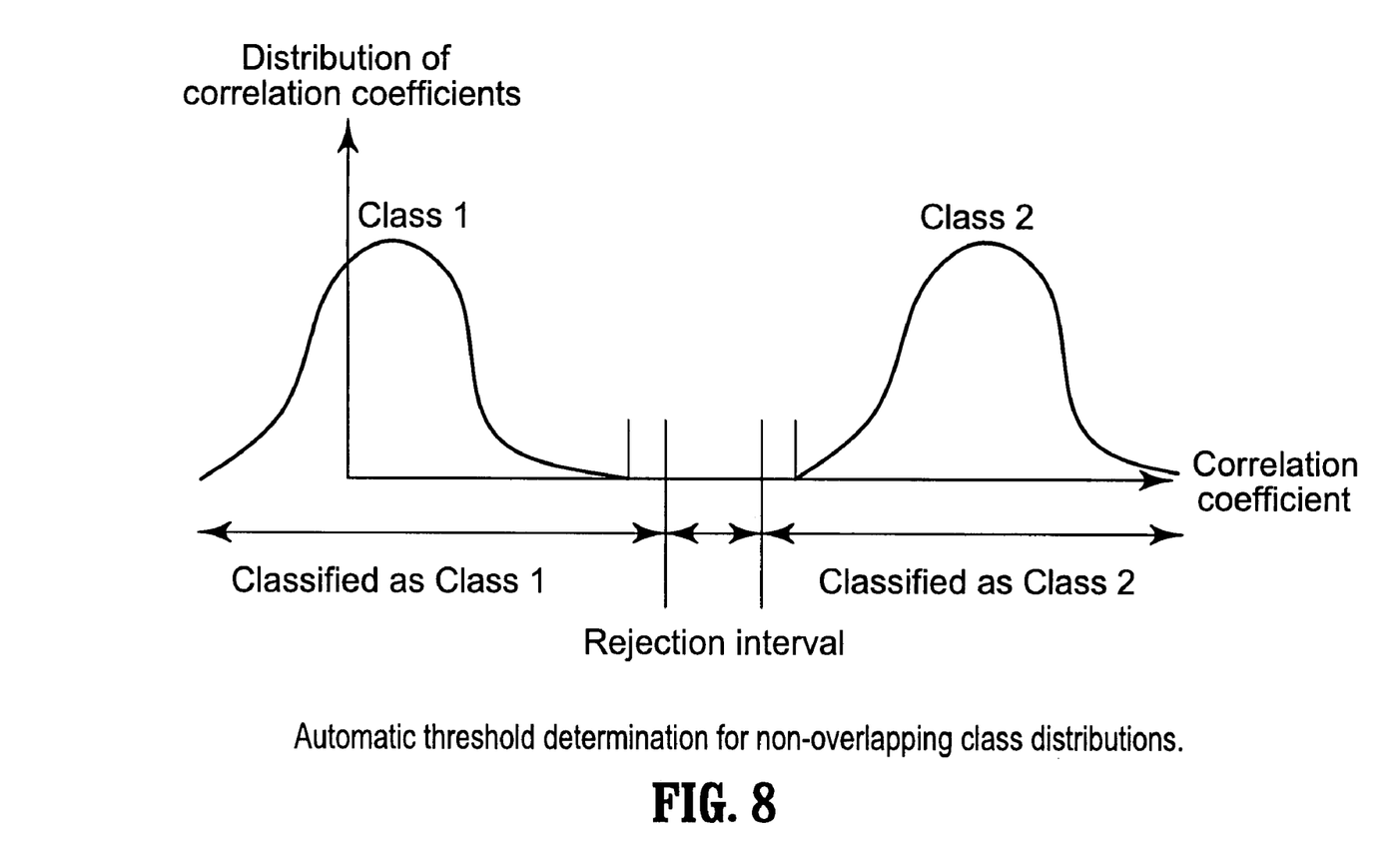
FIG. 8 is a diagram illustrating a method for automatic threshold determination according to another aspect of the present invention.

The automatic threshold determination process requires templates from both classes. Given an overlapping distribution of correlation coefficients as shown, for example, in FIG. 7, the rejection interval is determined to be the interval between the lowest correlation coefficient of the "bad"

template class (Class 2) and the highest correlation coefficient of the "good" template class (class 1). If both distributions do not overlap, as illustrated in FIG. 8., the rejection interval is centered between the maximum correlation coefficient of Class 1 and the minimum correlation coefficient of class 2. The width of the rejection interval is preferably defined to be half of the distance between the maximum correlation coefficient of Class 1 and the minimum correlation coefficient of class 2. It is to be understood by those skilled in the art that more sophisticated statistical techniques may be employed to model the distribution of the correlation coefficients and to determine the thresholds. Such methods are preferably only applied if a significant number of training samples from both classes are collected.

When a maker comprises an irregular or strongly varying shape or if the position of the marker (e.g., ink spot) is inaccurate (i.e. if no calibration has been performed in advance), then a histogram-based recognition process in accordance with the present invention may be implemented to achieve more optimal results. The histogram approach relies on the gray value distribution rather than the shape feature.

Figure 9:
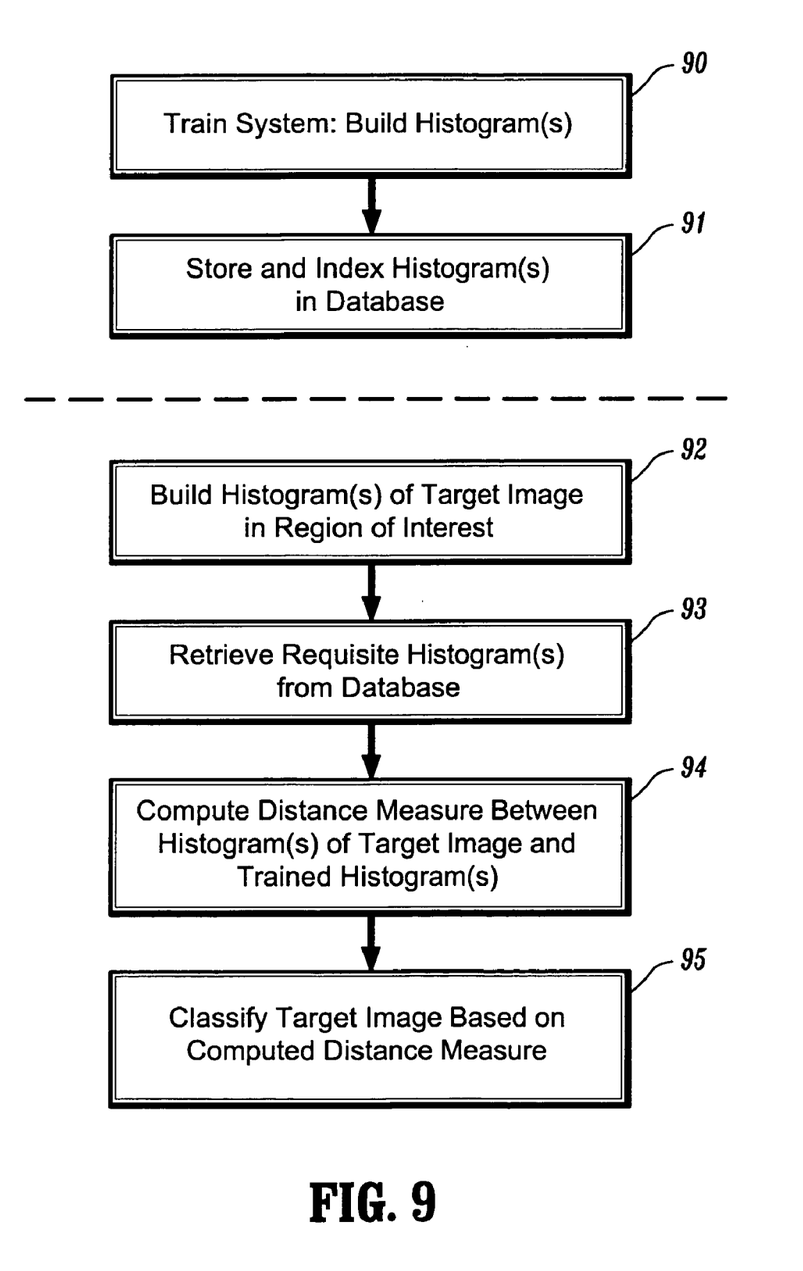
FIG. 9 is a flow diagram of a method for recognizing markers on a PCB according to another aspect of the present invention.

Referring now to FIG. 9, a flow diagram illustrates a method for recognizing markers according to one aspect of the present invention using histogram-based marker recognition. Initially, prior to recognition, a training process is performed to train the marker recognition system (step 90). Training involves building one or more histograms for each pattern, wherein each histogram preferably comprises a gray value resolution of 32 (5 bits). Preferably, at least one training image is generated for a "good" histogram class and a "bad" histogram class, although multiple histograms in each class would provide increased recognition results. The histograms are stored and indexed in a database (step 91).

Once the training process is complete and the trained histograms are available, a histogram-based marker recognition process according to the present invention may be performed to detect a marker on a PCB. The first step involves extracting the relevant image features of a target image within a ROI (region of interest), and generating a histogram of the target image (step 92). In one embodiment illustrated in FIG. 10*a*, a global histogram is extracted. In another embodiment illustrated in FIG. 10*b*, multiple local histograms are extracted instead of one global histogram, which allows the recognition process to utilize spatial information.

Figure 10A:
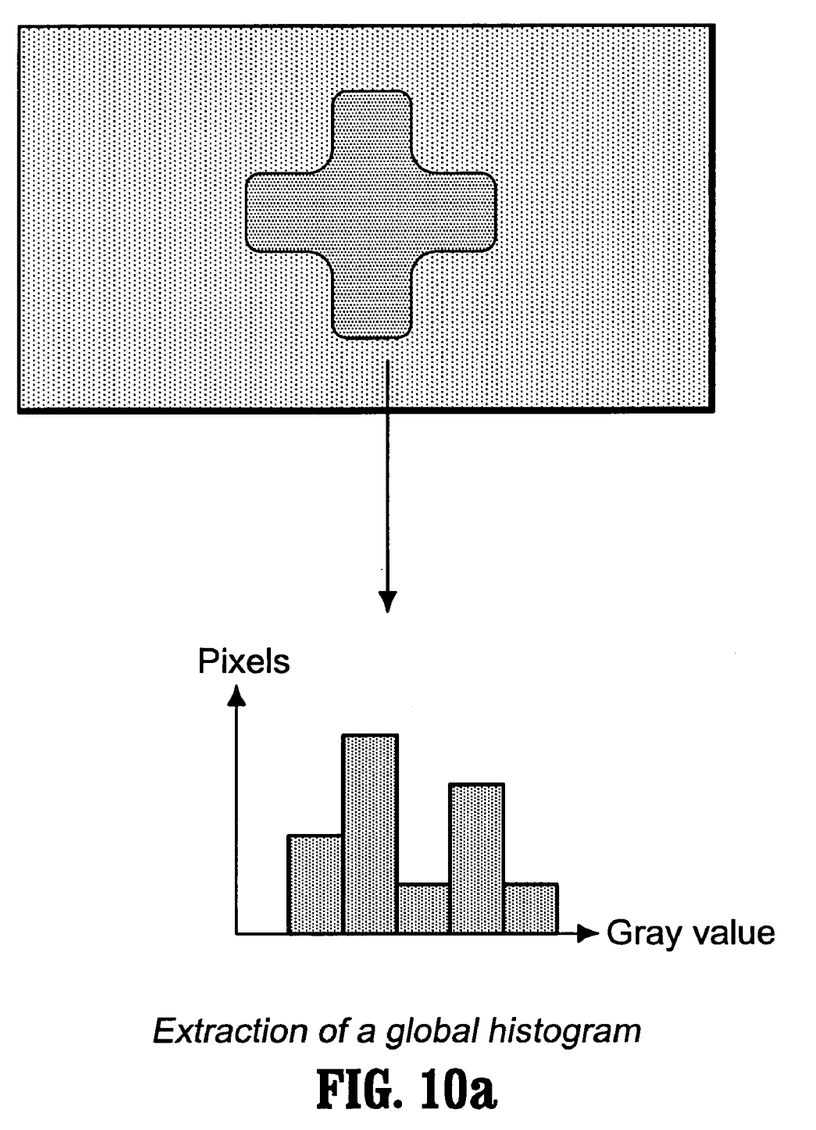
FIGS. 10a and 10b respectively illustrate methods for extracting a global histogram and a plurality of local histograms for a target image according to the present invention.
Figure 10B:
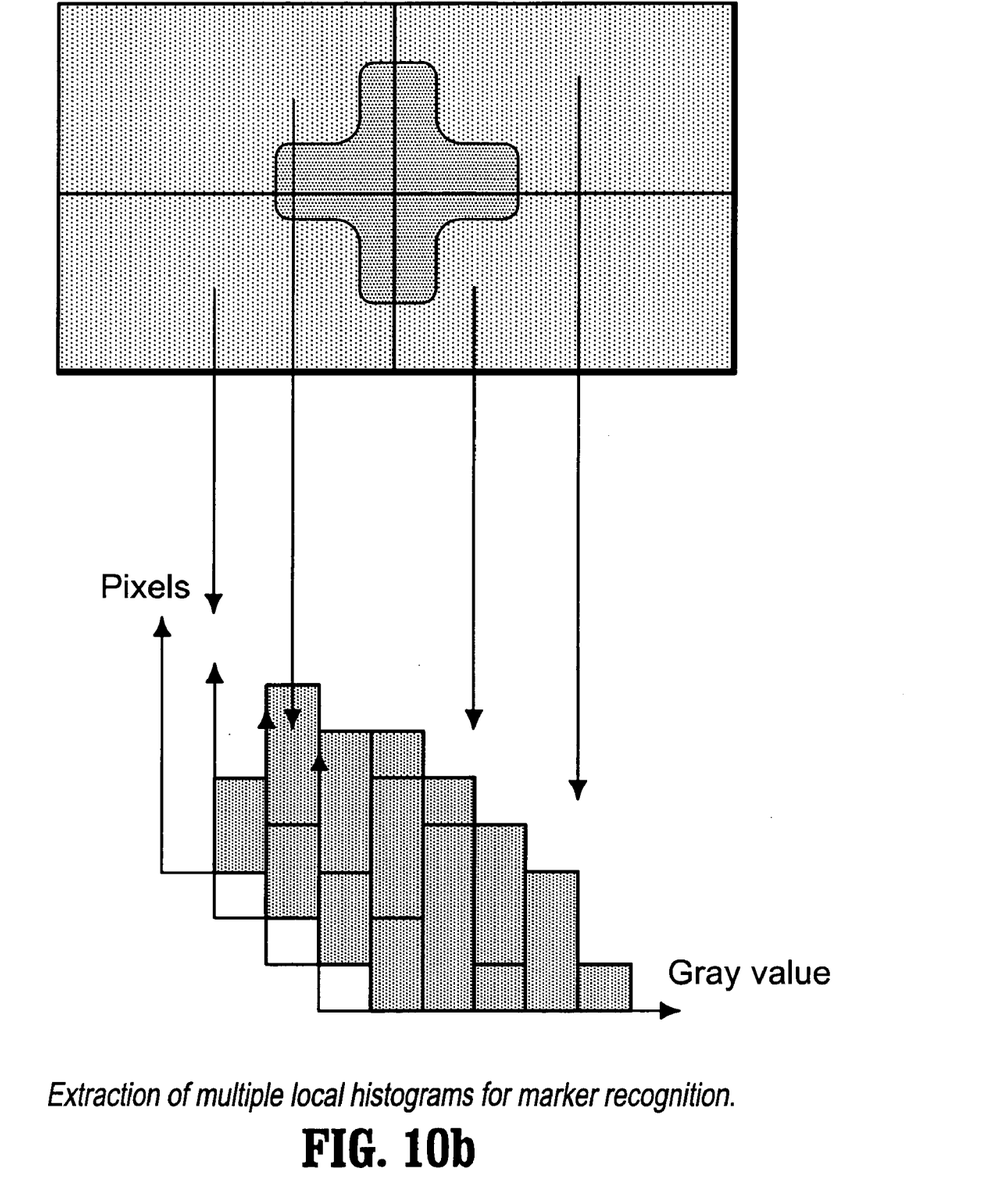

More specifically, FIG. 10*a* illustrates an embodiment wherein a single histogram is computed from an original image by counting the number of pixels that fall into each gray value interval. Preferably, 16 bins are sufficient for the histogram, however this parameter can be modified manually. As a result, a feature vector with 16 components is preferably computed for marker classification Further, FIG. 10*b* illustrates another embodiment wherein multiple histograms are used for marker classification. Preferably, the region containing the marker is divided into n×n image patches of equal size. In the exemplary embodiment of FIG. 10*b*, n=2. A histogram for each sub image is computed separately and the resulting n×n feature vectors are combined to form one feature vector, preferably having n×n×16 components for classification. Multiple histograms contain information about the gray value distribution similar to a global histogram. It is to be appreciated that the multiple histogram approach also preserves information regarding the spatial distribution. Thus, it is to be appreciated that the properties associated with multiple histograms provides a compromise between a global histogram on one hand and the template-based approach on the other hand.

Referring again to FIG. 9, the requisite histograms (generated during training) are retrieved from memory (step 93). Once the histogram is generated (in step 92), a distance measure, preferably a Euclidian distance, is computed between the ROI histogram and each stored histogram vectors (step 94). It is to be understood that the same distance measure may be applied for both the global and multiple histogram. Indeed, for multiple histograms, the n×n local histograms are combined to form one larger feature vector, which does not affect the distance computation.

The target image is then classified based on the computed distance measure (step 95), preferably using a Minimum Distance Classifier. More specifically, in the training phase, an average histogram is computed for the "good" class by adding the histograms from each training image. A vector sum in the sense of pixel wise addition is performed. Similarly, for the "bad" class, an average histogram is computed by adding the histograms from the respective training images. Thus, a prototype for "good" and "bad" class is generated. Then, in the classification phase (step 95) using Minimum Distance Classification, the Euclidean distance between each prototype and the histogram of the target image (computed in step 94) is used to assign the target image to the class having the smaller distance to the respective prototype.

It is to be understood that the training process employed herein for both the histogram and template process are generally based on techniques known in the art. However, training involves steps that are unique to the present invention. More specifically, given a set of training images of the two classes (good and bad), both techniques—histogram and template based—are optimized and their respective thresholds are adjusted. Both methods are then automatically evaluated based on the available training data and a table is generated comprising information such as the percentage of correct classifications, wrong classifications and rejected samples. This table allows the performance of the two methods to be directly compared and the best method can be selected. This training technique becomes even more important, if in addition to histogram and template, other features such as brightness and contrast are considered. The table allows the results of all such features to be compared against each other in order to select the best feature.

The present invention provides a novel method for detecting markers on printed circuit boards based on gray value histograms and normalized correlation. The present invention can be readily applied to recognize a new type of marker. To demonstrate the feasibility of the proposed algorithm, images from 10 different types of markers with varying brightness and contrast were processed using the techniques described herein and no misclassification had occurred on a set of approximately 150 images.

Advantageously, the present invention may be used to recognize all types of markers because it uses multiple features and it can be trained for specific markers by presenting sample images of both classes (good/bad). In addition, because the invention applied adaptive techniques, the teach-in process is simplified and manual setting of parameters is minimized. In the exemplary embodiment described herein, the only manual decision is the choice between template and histogram algorithm. Subsequent parameters are determined automatically if sufficient training images are provided (although it is to be understood that such parameters can be modified manually to meet specific needs).

In the experiment described above, it was sufficient to select the one feature (histogram or template) to achieve reliable results. It is to be understood, however, that the present invention may be extended based on the application. For example, other features may be considered in addition to, or in lieu of, histogram and template (e.g., brightness, contrast). Further, an algorithm that implements a combination of different features may improve the performance. Further, the classification process may be modified to utilize several prototypes per class (good and bad) for circumstances where it is difficult to achieve sufficient discrimination based on one prototype per class. In addition, any suitable statistical classifier such as Nearest Neighbor Classifier, Minimum Distance Classifier or a Neural Network, may be utilized.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for detecting a marker in an image, comprising the steps of:
    selecting one of a first marker recognition process based on a normalized correlation and a second marker recognition process based on gray value histograms;
    extracting image features associated with an input image of a ROI (region of interest); and
    comparing the extracted image features with a trained model associated with the selected recognition process to determine if a marker is present in the input image,
    wherein if the first marker recognition process is selected, the trained model comprises at least one template image for a first template class and at least one template image for a second template class, wherein the at least one template image for the first template class is trained from one or more images of the ROI having a maker, and wherein the at least one template image for the second template class is trained from one or more images of the ROI not having the marker, and wherein the step of comparing comprises the steps of:
    normalizing the template images and input image with respect to brightness;
    computing a correlation between the input image and each normalized template image; and
    determining if a marker is present in the input image based on the computed correlations.

2. The method of claim 1, wherein the step of normalizing comprises computing $$I(i) = \frac{(I(i) - \mu)}{\sigma},$$

where I(i) is the gray value of pixel I and where $\mu$ and $\sigma$ denote the average brightness and contrast, respectively.

3. The method of claim 1, wherein the step of computing a correlation comprises computing $$\rho = \sum_{allpixels} I(i) * T(i)$$

where $\rho$ comprises the correlation coefficient, I comprises the input image, and T comprises the template image.

4. The method of claim 1, further comprising the step of computing the at least one template image for the first or second template class from an average of a plurality of template images of the first or second template class.

5. The method of claim 1, wherein the step of determining if a marker is present in the input image is based on a maximum computed correlation.

6. The method of claim 1, further comprising the step of reducing the resolution of the input image and the template image by a predetermined factor prior to the comparing step.

7. A method for detecting a marker in an image, comprising the steps of:
    selecting one of a first marker recognition process based on a normalized correlation and a second marker recognition process based on gray value histograms;
    extracting image features associated with an input image of a ROI (region of interest); and
    comparing the extracted image features with a trained model associated with the selected recognition process to determine if a marker is present in the input image,
    wherein if the second marker recognition process is selected, the trained model comprises a sample image histogram comprising a gray value distribution of a sample image and the step of comparing comprises the steps of:
    generating a local image histogram comprising a gray value distribution for each of a plurality of equal-sized sub-regions of the input image;
    combining the local image histograms to form a single histogram representation;
    computing a distance measure between the single histogram representation and the sample image histogram; and
    determining if a marker is present in the input image based on the computed distance measure.

8. A program storage device readable by a machine, tangibly embodying a program of instructions executable by the machine to perform method steps for detecting a marker in an image, the method comprising the steps of:
    selecting one of a first marker recognition process based on a normalized correlation and a second marker recognition process based on gray value histograms;
    extracting image features associated with an input image of a ROI (region of interest); and
    comparing the extracted image features with a trained model associated with the selected recognition process to determine if a marker is present in the input image,
    wherein if the first marker recognition process is selected, the trained model comprises at least one template image for a first template class and at least one template image for a second template class, wherein the at least one template image for the first template class is trained from one or more images of the ROI having a maker, and wherein the at least one template image for the second template class is trained from one or more images of the ROI not having the marker, and wherein the step of comparing comprises the steps of:
    normalizing the template images and input image with respect to brightness;

computing a correlation between the input image and each normalized template image; and determining if a marker is present in the input image based on the computed correlations.

9. The program storage device of claim 8, wherein the instructions for normalizing comprise instructions for computing $$I(i) = \frac{(I(i) - \mu)}{\sigma},$$

where I(i) is the gray value of pixel I and where $\mu$ and $\sigma$ denote the average brightness and contrast, respectively.

10. The program storage device of claim 8, wherein the instructions for computing a correlation comprise instructions for computing $$\rho = \sum_{allpixels} I(i) * T(i))$$

where $\rho$ comprises the correlation coefficient, I comprises the input image, and T comprises the template image.

11. The program storage device of claim 8, further comprising instructions for computing the at least one template image for the first or second template class from an average of a plurality of template images of the first or second template class.

12. The program storage device of claim 8, wherein the step of determining if a marker is present in the input image is based on a maximum computed correlation.

13. The program storage device of claim 8, further comprising instructions for the step of reducing the resolution of the input image and the template image by a predetermined factor prior to the comparing step.

14. A program storage device readable by a machine, tangibly embodying a program of instructions executable by the machine to perform method steps for detecting a marker in an image, the method comprising the steps of:

selecting one of a first marker recognition process based on a normalized correlation and a second marker recognition process based on gray value histograms;

extracting image features associated with an input image of a ROI (region of interest); and comparing the extracted image features with a trained model associated with the selected recognition process to determine if a marker is present in the input image, wherein if the second marker recognition process is selected, the trained model comprises a sample image histogram comprising a gray value distribution of a sample image and the instructions for the step of comparing comprise instructions for:

generating a local image histogram comprising a gray value distribution for each of a plurality of equal-sized sub-regions of the input image;

combining the local image histograms to form a single histogram representation;

computing a distance measure between the single histogram representation and the sample image histogram; and determining if a marker is present in the input image based on the computed distance measure.

* * * * *